United States Patent
Trummer-Sailer et al.

(10) Patent No.: US 10,084,158 B2
(45) Date of Patent: Sep. 25, 2018

(54) OPTOELECTRONIC COMPONENT AND METHOD OF PRODUCING AN OPTOELECTRONIC COMPONENT

(71) Applicant: OSRAM OLED GmbH, Regensburg (DE)

(72) Inventors: Evelyn Trummer-Sailer, Mintraching (DE); Simon Schicktanz, Regensburg (DE); Tobias Pohl-Zander, Regensburg (DE)

(73) Assignee: OSRAM OLED GmbH (DE)

( * ) Notice: Subject to any disclaimer, the term of this patent is extended or adjusted under 35 U.S.C. 154(b) by 134 days.

(21) Appl. No.: 15/160,001

(22) Filed: May 20, 2016

(65) Prior Publication Data
US 2016/0343972 A1 Nov. 24, 2016

(30) Foreign Application Priority Data
May 21, 2015 (DE) .................. 10 2015 108 071

(51) Int. Cl.
*H01L 51/52* (2006.01)
*H01L 51/56* (2006.01)

(52) U.S. Cl.
CPC .......... *H01L 51/529* (2013.01); *H01L 51/524* (2013.01); *H01L 51/56* (2013.01)

(58) Field of Classification Search
CPC ...... H01L 51/529; H01L 51/56; H01L 51/524
USPC .......................................................... 257/40
See application file for complete search history.

(56) References Cited

U.S. PATENT DOCUMENTS

2006/0279949 A1\* 12/2006 Shin ........................ H01L 33/62
362/236

FOREIGN PATENT DOCUMENTS

| DE | 103 01 559 A1 | 10/2003 |
| WO | 02/061805 A2 | 8/2002 |
| WO | 2010/131156 A1 | 11/2010 |

\* cited by examiner

*Primary Examiner* — Fernando L. Toledo
*Assistant Examiner* — Adam S Bowen
(74) *Attorney, Agent, or Firm* — DLA Piper LLP (US)

(57) ABSTRACT

The invention relates to an optoelectronic component (100) comprising an organic light emitting diode (1) designed for emitting radiation and/or heat, a substrate (2), on which the organic light emitting diode is arranged, wherein the substrate (2) comprises a first substrate material (21) and at least one substrate cavity (22) which is filled with a second substrate material (23) different than the first substrate material (21), wherein the second substrate material (23) is designed to dissipate the heat emitted by the organic light emitting diode (1).

15 Claims, 3 Drawing Sheets

Figure 6:
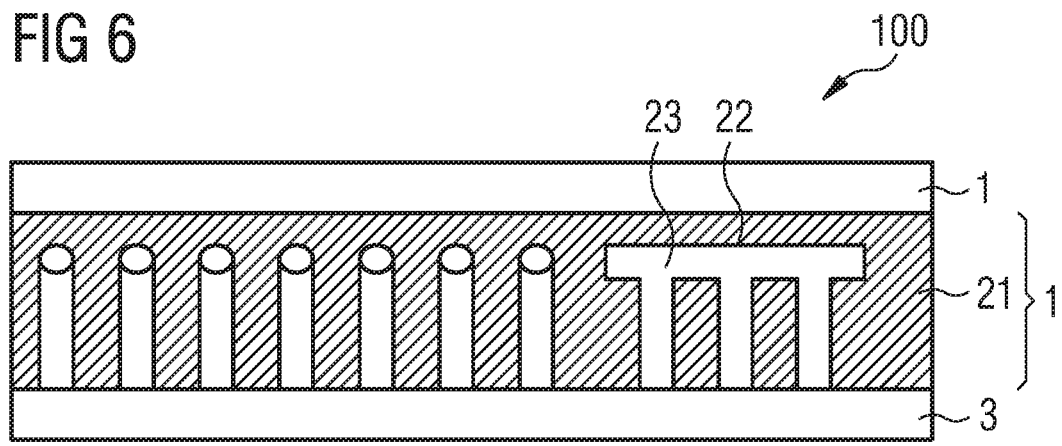

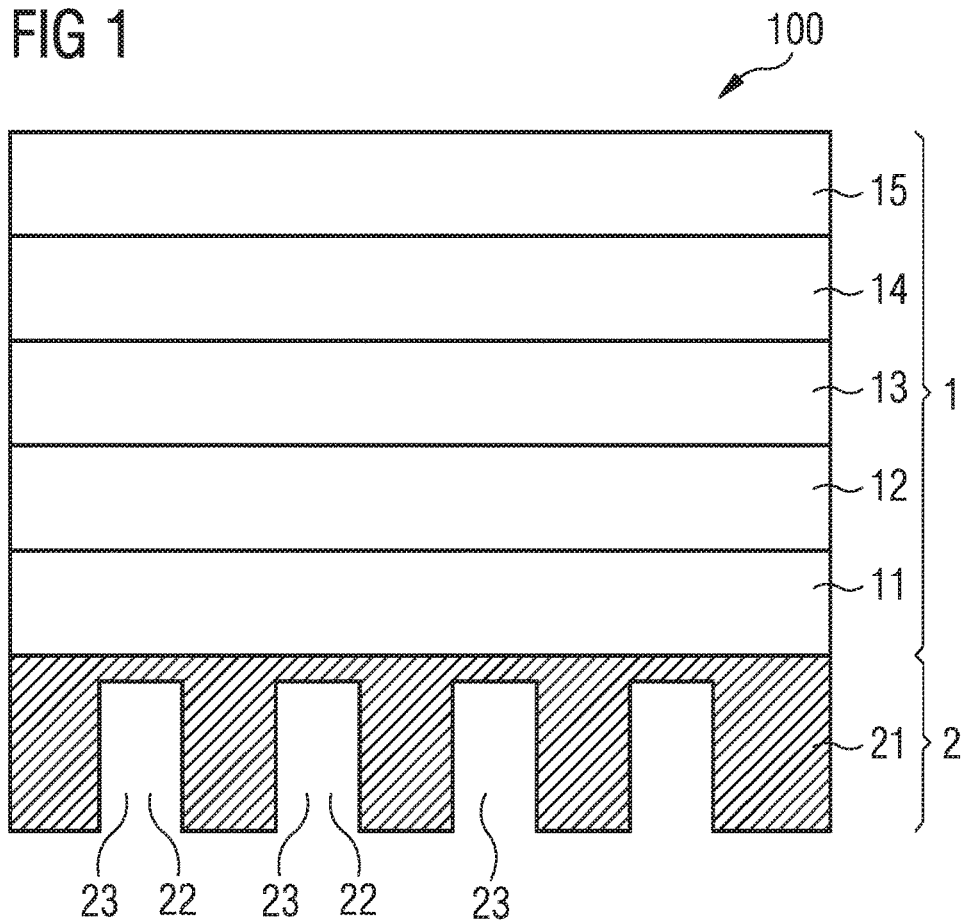
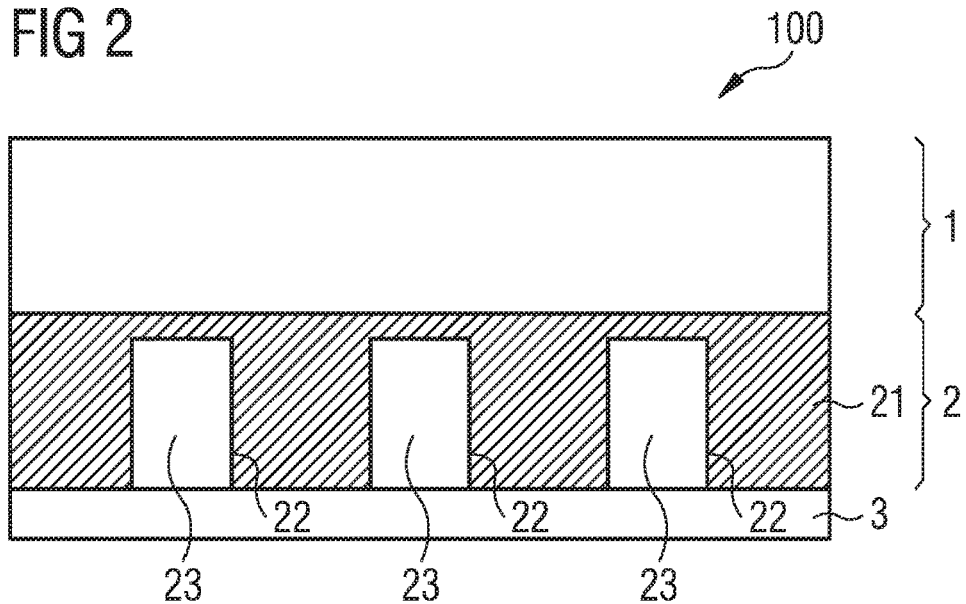

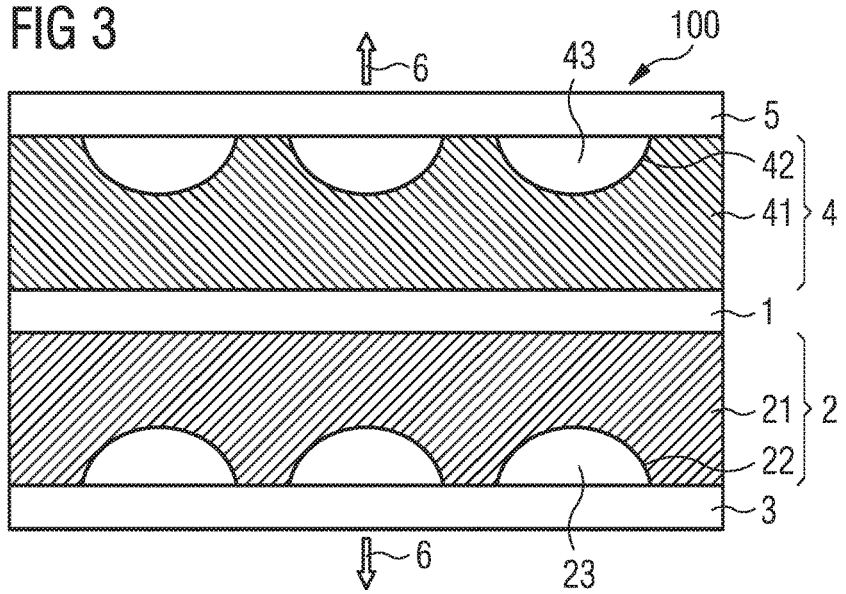
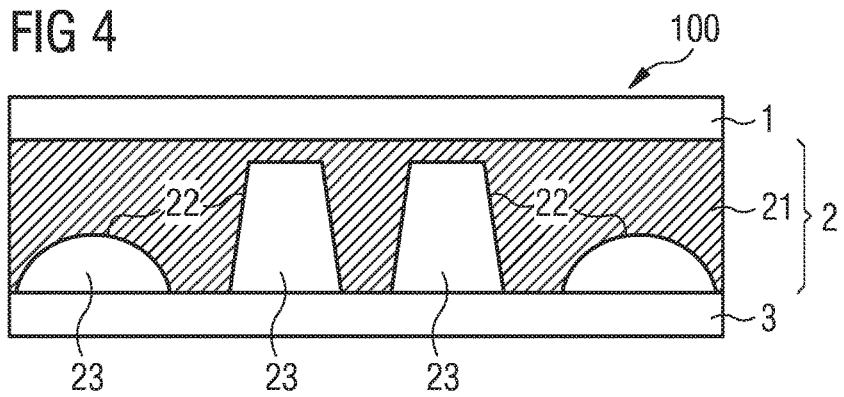
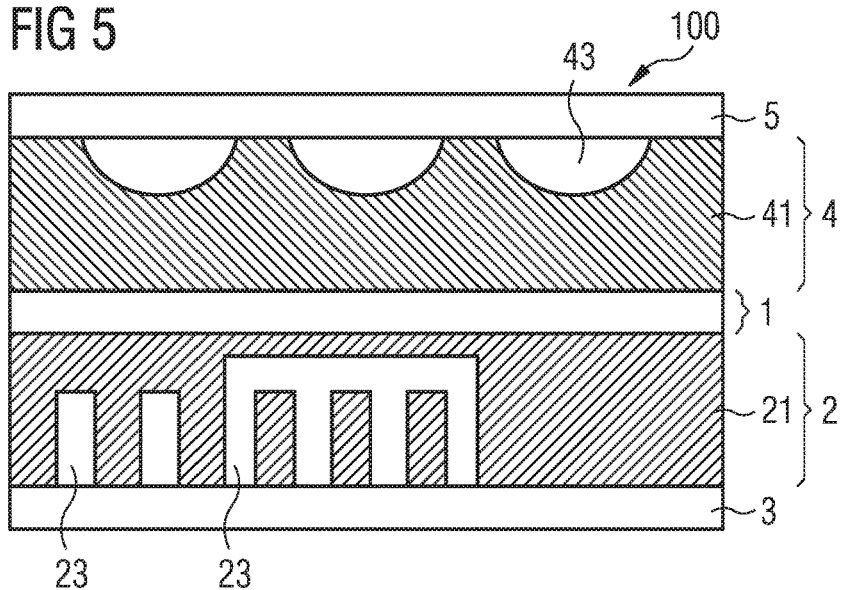

OPTOELECTRONIC COMPONENT AND METHOD OF PRODUCING AN OPTOELECTRONIC COMPONENT

The invention relates to an optoelectronic component. Furthermore, the invention relates to a method for producing an optoelectronic component.

During the operation of organic light emitting diodes (OLEDs), intrinsic heating generally takes place. This leads to the rapid aging of the light emitting diode and to inhomogeneities in the luminous image. In order to realize a uniform heat distribution, for example films composed of metal, such as aluminum, or composed of graphite could be used. However, these are not transparent, and so they cannot be employed in the case of transparent OLEDs, in particular. Conventional methods for heat dissipation cannot be used in the case of transparent components.

It is an object of the invention to provide a stable optoelectronic component. In particular, it is an object of the invention to provide an optoelectronic component which exhibits long-term stability.

These objects are achieved by means of an optoelectronic component according to independent claim 1. The dependent claims relate to advantageous configurations and developments of the invention. Furthermore, these objects are achieved by means of a method for producing an optoelectronic component according to claim 14. Dependent claim 15 relates to advantageous configurations and developments of the method.

In at least one embodiment, the optoelectronic component comprises an organic light emitting diode. The organic light emitting diode is designed for emitting radiation. Alternatively or additionally, the organic light emitting diode is designed to emit heat. The optoelectronic component comprises a substrate. The organic light emitting diode is arranged on the substrate, in particular in direct mechanical contact. The substrate comprises a first substrate material. The substrate comprises at least one substrate cavity. The substrate cavity comprises a second substrate material. In particular, the substrate cavity is filled with the second substrate material. The second substrate material is different than the first substrate material. The second substrate material is designed to dissipate the heat emitted by the organic light emitting diode.

In accordance with at least one embodiment, the organic light emitting diode comprises at least two electrodes between which an organic functional layer stack is arranged.

The organic functional layer stack can comprise layers comprising organic polymers, organic oligomers, organic monomers, organic small non-polymeric molecules ("small molecules") or combinations thereof. The organic functional layer stack can additionally comprise further organic layers selected from hole injection layers, hole transport layers, electron injection layers, electron transport layers, hole blocking layers and electron blocking layers. In particular, the layers of the organic functional layer stack can be completely or at least predominantly organically functional layers. Furthermore, it may also be possible for individual layers of the organically functional layer stack also to comprise inorganic materials. The organic functional layer stack can comprise a hole transport layer in order to enable an effective injection of holes into a light emitting layer. By way of example, tertiary amines, carbazole derivatives, polyaniline doped with camphorsulfonic acid or polyethylene dioxythiophene doped with polystyrenesulfonic acid may prove to be advantageous as materials for a hole transport layer.

In accordance with at least one embodiment, at least one of the electrodes is embodied as transparent. Here and hereinafter, transparent denotes a layer which is transmissive to visible light. In this case, the transparent layer can be clearly translucent or at least partly light-scattering and/or partly light-absorbing, such that the transparent layer can for example also be diffusely or milkily translucent. Particularly preferably, a layer designated here as transparent is as light-transmissive as possible, such that in particular the absorption of light generated in the organic functional layer stack during the operation of the component is as small as possible.

In accordance with at least one embodiment, both electrodes are embodied as transparent. The light generated in the organic functional layer stack can thus be emitted in both directions, that is to say through both electrodes. For the case where the optoelectronic component comprises a substrate, this means that light can be emitted both through the substrate, which is then likewise embodied as transparent, and in the direction facing away from the substrate. Furthermore, in this case, all layers of the organic light emitting component can be embodied as transparent, such that the optoelectronic component forms a transparent OLED.

Furthermore, it may also be possible for one of the two electrodes between which the organic functional layer stack is arranged to be embodied as nontransparent and preferably reflective, such that the light generated in the organic functional layer stack can be emitted only in one direction through the transparent electrode. If the electrode arranged on the substrate is transparent and if the substrate is also embodied as transparent, then this is also referred to as a so-called bottom emitter, while in the case where the electrode arranged facing away from the substrate is embodied as transparent, this is referred to as a so-called top emitter.

By way of example, a transparent conductive oxide can be used as material for a transparent electrode. Transparent conductive oxides (TCOs) are transparent conductive materials, generally metal oxides such as, for example, zinc oxide, tin oxide, cadmium oxide, titanium oxide, indium oxide, indium tin oxide (ITO) or aluminum zinc oxide (AZO). Alongside binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

In accordance with at least one embodiment, the organic light emitting diode is a transparent organic light emitting diode. In particular, the optoelectronic component is embodied as transparent.

In accordance with at least one embodiment, the organic light emitting diode is embodied as a top emitter.

In accordance with at least one embodiment, the organic light emitting diode is designed for emitting radiation. In particular, the organic light emitting diode emits radiation during the operation of the light emitting diode. In particular, the radiation is generated in the organic functional layer stack of the organic light emitting diode. A wavelength or the wavelength maximum of the radiation is preferably in the ultraviolet and/or visible spectral range, in particular at wavelengths of between 420 nm and 680 nm inclusive.

In accordance with at least one embodiment, the organic light emitting diode is designed to emit heat. In particular, the organic light emitting diode emits heat during the operation of the optoelectronic component. The heat results on account of the intrinsic heating. The production of the heat within the organic light emitting diode leads to a rapid aging and also to inhomogeneities in the luminous image. Therefore, it is worthwhile to dissipate the heat arising in the organic light emitting diode. This can be effected via a substrate, in particular. In particular, a structured substrate is designed for dissipating the heat.

Here and hereinafter, structuring means that the substrate and/or the cover element comprise(s) regions capable of dissipating the heat arising in the optoelectronic component. In particular, the regions are substrate cavities and/or cover element cavities.

In accordance with at least one embodiment, the substrate comprises at least one substrate cavity. In particular, more than one substrate cavity, for example two, three, four or more than ten, are present within the substrate. The substrate cavities can be distributed homogeneously within the substrate. Alternatively or additionally, the substrate cavities can also be arranged inhomogeneously within the substrate, depending on local heat that arises.

The substrate cavities can have any possible form. In particular, the substrate cavities can be configured in the form of microchannels.

In accordance with at least one embodiment, the substrate cavities can be shaped in the form of a hemisphere, a cylinder and/or a cuboid.

The substrate furthermore comprises a first substrate material. In particular, the substrate consists of a first substrate material. The substrate cavities are arranged within the substrate. The substrate cavities are filled with a second substrate material. In particular, the second substrate material is different than the first substrate material. The second substrate material is capable of dissipating the heat emitted by the organic light emitting diode better than the first substrate material. In particular, the second substrate material dissipates heat during the operation of the organic light emitting diode.

The substrate can comprise for example one or more materials in the form of a layer, a plate, a film or a laminate which are selected from glass, quartz, plastic, metal, silicon wafer. Particularly preferably, the substrate comprises or is composed of glass, for example in the form of a glass layer, glass film or glass plate. Alternatively, the substrate can comprise or be formed from a plastic film or a laminate composed of a plurality of plastic films and/or glass films.

In accordance with at least one embodiment, the optoelectronic component comprises a cover element. The cover element comprises a first cover material or consists thereof. The cover element comprises at least one cover element cavity. In particular, the cover element comprises more than one, for example two, three, four or more than ten, cover element cavities. The cover element cavity is filled with a second cover material. The second cover material is different than the first cover material. "Filled" here means, in particular, that the hollow space of the substrate and/or cover element cavity is completely potted with the second substrate and/or cover material.

Here and hereinafter, substrate and/or cover element cavity denotes a region which forms a structure within the substrate and/or cover element. In particular, the substrate and/or cover element cavity is a microchannel or a hollow space in which the second substrate and/or cover material can be incorporated or arranged. In this case, the same explanations and definitions as specified for the substrate cavity hold true for the cover element cavity, and vice versa.

In particular, the cover element and the substrate are structurally identical. In particular, the substrate and the cover element have an identical layer thickness and an identical form. It is thus possible to dissipate heat from the OLED from both sides.

The substrate and/or cover element are/is shaped in particular in each case as a layer. In particular, the substrate and/or cover element have/has a layer thickness of 0.1 to 3 mm, in particular 0.4 to 0.8, for example 0.7 mm, therein. Alternatively, the cover element can have a smaller layer thickness than the layer thickness of the substrate, for example less than or equal to 0.2 mm.

Alternatively or additionally, the optoelectronic component, in particular a transparent organic light emitting diode, can be arranged between the cover element and the substrate, that is to say emits in particular radiation via the substrate and also via the cover element.

Alternatively or additionally, the first substrate material has a refractive index $n1$ and a first specific heat capacity $c1$. The second substrate material has a refractive index $n2=n1+/-0.2$, in particular $n2=n1+/-0.1$, $n2=n1+/-0.08$, $n2=n1+/-0.05$, $n2=n1+/-0.03$ or $n2=n1+/-0.02$. The second substrate material has a specific heat capacity $c2>c1$. The first cover material has a refractive index $n3$ and a specific heat capacity $c3$. The second cover material has a refractive index $n4=n3+/-0.2$, in particular $n4=n3+/-0.1$, $n4=n3+/-0.08$, $n4=n3+/-0.05$, $n4=n3+/-0.03$ or $n4=n3+/-0.02$. The second cover material has a fourth specific heat capacity $c4>c3$.

Here and hereinafter, specific heat capacity or mass-related heat capacity c is understood to be a material characteristic parameter. Here and hereinafter, specific heat capacity denotes that quantity of heat which can be taken up or emitted by a body per unit mass when the temperature increases or decreases by a temperature unit $\Delta T$. The specific heat capacity is temperature-dependent. Insofar as specific heat capacities without temperature indication are indicated here, they relate to room temperature.

Here and hereinafter, refractive index denotes an optical material property which indicates by what factor the wavelength and the phase velocity of the light are less than in a vacuum. Unless indicated otherwise here, the values indicated here for the refractive index are related to room temperature.

In accordance with at least one embodiment, the first substrate material and/or the first cover material are/is solid. In particular, the first substrate material and/or first cover material have/has a solid state of matter both at room temperature and during the operation of the organic light emitting diode (OLED). Alternatively or additionally, the second substrate material and/or the second cover material are/is liquid. In particular, the second substrate material and/or the second cover material are/is liquid during the operation of the OLED and/or at room temperature. In particular, the following holds true for the specific heat capacities: $c2>3 \cdot c1$ and/or $c4>3 \cdot c3$.

In other words, an optoelectronic component is provided here which comprises liquid materials in its substrate and/or cover element cavities, which materials have a refractive index similar to the refractive index of the first substrate material and/or cover material. However, the specific heat capacities of the second substrate material and/or cover material are greater than those of the first substrate material and/or cover material. In particular, the specific heat capacity of the second substrate material and/or of the second cover material is 3 times, in particular 4, 4.5, 4.7, 4.8 times, greater than the specific heat capacity of the first substrate material and/or of the first cover material. Thus, advantageously, light can be emitted from the optoelectronic component via the substrate and/or cover element and heat dissipation and/or better heat distribution for the OLED can simultaneously be achieved.

In accordance with at least one embodiment, it holds true that: $c1=c3$ and/or $c2=c4$.

In accordance with at least one embodiment, it holds true that: $n1=n3$ and $n2=n1\pm0.02$ and/or $n2=n4$ and $n4=n3\pm0.02$. In particular, it holds true that: $n1=n3$ and $n2=n1\pm0.05$ and/or $n2=n4$ and $n4=n3\pm0.05$.

In accordance with at least one embodiment, the first substrate material and/or the first cover material comprise(s) glass. In particular, the first substrate material and/or the first cover material consist(s) of glass. Alternatively or additionally, the second substrate material and/or the second cover material are/is selected from a group comprising glycerol, immersion oil, cedar oil, silicone oil, mineral oil, glycol, fluorocarbons. In particular, the second substrate material and/or the second cover material are/is glycerol. Glycerol has the advantage that glycerol has a refractive index of 1.475 or 1.47 and a specific heat capacity of 2.4 kJ/kg·K. Glycerol thus has a specific heat capacity more than three times higher than that of glass and can easily dissipate the heat arising in the OLED. Glass has in particular a refractive index of 1.4.

Immersion oil here denotes a liquid mixture from the field of microscopy and/or objective production. The advantage is that the refractive index can be set between 1.4 and 1.58 by means of the mixing ratio of the liquid mixture. Moreover, immersion oils have a high specific heat capacity.

Cedar oil has in particular a refractive index of 1.5. Cedar oil may also be an immersion oil.

Silicone oil here denotes a diorganopolysiloxane or polymerized siloxane having organic side chains. In contrast to mineral oils or vegetable oils, these do not comprise organic, that is to say carbon-based, but rather siloxane-based chain molecules as basic structure. Silicone oil has a periodically alternating arrangement of silicon and oxygen atoms having the general empirical formula $[R_1R_2SiO]_n$, wherein $R_1$ and $R_2$ are organic radicals and n represents the repeating monomer unit. Silicone oil has a refractive index of between 1.36 and 1.405 inclusive and/or a specific heat capacity of between 1.5 and 1.6 kJ/kg·K inclusive.

Mineral oil has a refractive index of between 1.475 and 1.535 inclusive and/or a specific heat capacity of between 1.8 and 1.9 kJ/kg·K inclusive. Although the specific heat capacity of the mineral oil is lower than that for glycerol, the specific heat capacity of the mineral oil is still significantly higher than the specific heat capacity of glass, in particular 1.5 times to more than three times greater.

Glycol has a refractive index of between 1.42 and 1.44 inclusive, for example 1.43, and/or a specific heat capacity of between 2.3 and 2.5 kJ/kg·K inclusive, for example 2.4 kJ/kg·K.

Fluorocarbons here means a group of substances comprising at least one perfluorinated carbon chain. In particular, perfluoropolyether (PFPE) is used as a fluorocarbon. Fluorocarbons, for example PFPE, have a refractive index of between 1.4 and 1.43 inclusive and/or a specific heat capacity of between 0.8 and 1.5 kJ/kg·K inclusive, for example 1.0 kJ/kg·K.

In accordance with at least one embodiment, the optoelectronic component additionally comprises a first covering layer and/or a second covering layer. The first covering layer is disposed directly downstream of the substrate. "Directly" here means a direct electrical and/or mechanical contact. In this case, the first covering layer covers in particular at least the substrate cavity. The second covering layer is disposed directly downstream of the cover element. In this case, the second covering layer covers at least the cover element cavity. In this case, the covering layers have the task of sealing the cavities, that is to say the substrate cavity and the cover element cavities, particularly if the cavities are filled with a liquid second substrate and/or cover material. This can be effected by applying by adhesive bonding a transparent cover film as first covering layer and/or second covering layer.

In accordance with at least one embodiment, the first covering layer and/or the second covering layer are/is shaped as a prefabricated self-adhesive glass film and/or self-adhesive plastic film. In particular, the first covering layer and/or the second covering layer have/has further functions, such as UV protection and/or coupling-out protection, for example. In particular, the first covering layer and/or the second covering layer are/is shaped as a UV film and/or scattering film. In particular, the self-adhesive plastic film consists of polycarbonate (PC) and/or polymethyl methacrylate (PMMA). The first covering layer and/or the second covering layer can have a layer thickness of 150 μm to 250 μm, for example 200 μm.

In accordance with at least one embodiment, the first covering layer and/or the second covering layer are/is shaped as a glass film which is not prefabricated and/or self-adhesive.

In particular, the first covering layer and/or the second covering layer are/is colored. As a result, the light emitted by the organic light emitting diode, which light is white, for example, can be colored by the first covering layer and/or the second covering layer, for example green. The first and/or second covering layer can be adhesively bonded onto the substrate or cover element. In particular, the first and/or second covering layer are/is self-adhesive. In this case, the first covering layer and/or the second covering layer offer firstly mechanical protection and secondly sealing of the cavities. Thus, in particular, the cavities filled with liquid cannot leak and, consequently, the heat arising in the organic light emitting diode can be dissipated uniformly.

In accordance with at least one embodiment, the substrate cavity and/or the cover element cavity are/is shaped in the form of a hemisphere, a cylinder or a cuboid. The substrate cavity and/or the cover element cavity can be embodied in any arbitrary polygon shape, e.g. as a cuboid or cylinder.

The form of the substrate cavity and/or of the cover element cavity is not restricted here. In particular, any forms are suitable which facilitate dissipation of the heat arising in the organic light emitting diode.

In particular, individual substrate cavities and/or cover element cavities can also be connected to one another. By way of example, microchannels can be present as substrate and/or cover element cavity within the substrate and/or cover element, these being connected to one another. This connection can be effected by etching, for example. It is thus possible to produce a homogeneous heat distribution by circulation of the second materials, that is to say of the second substrate material and/or of the second cover material.

In accordance with at least one embodiment, the substrate cavity and/or the cover element cavity are/is not in direct contact with the organic light emitting diode. In particular, the substrate cavity and/or cover element cavity project(s) into the substrate or the cover element without touching the side surfaces of the OLED in this case.

In accordance with at least one embodiment, the substrate and/or cover element are/is shaped in each case as a layer having a uniform layer thickness. The substrate cavity and/or the cover element cavity can be shaped in each case in a cylindrical fashion. In particular, the cylindrically shaped cavities in each case have a height h. The height h here projects in particular two thirds into the layer thickness of the substrate and/or of the cover element. In particular, the height h corresponds to two thirds of the layer thickness of the substrate and/or of the cover element.

In accordance with at least one embodiment, the organic light emitting diode is arranged on the substrate. In particular, the organic light emitting diode emits radiation via the radiation main side facing away from the substrate during operation. In other words, an OLED as a top emitter is provided here. In this case, the organic light emitting diode does not emit via the substrate. The substrate has a substrate cavity. The substrate cavity has a ribbed surface. In other words, the substrate cavity is shaped like a type of cooling rib. In this case, the first substrate material is solid and the second substrate material is gaseous; in particular, the second substrate material envelops or washes around the ribbed surface in order thereby to be able to dissipate heat emitted by the organic light emitting diode.

In other words, a substrate having a structured form is provided here. The form is in the form of a cooling rib, such that the second substrate material, for example air, can circulate through the cooling rib elements and can thus easily dissipate the heat arising from the OLED. In particular, the OLED is mounted at a location at which an air flow is present. By way of example, said air flow can be generated by the travel airstream in an automobile. In this case, the air flow can then flow continuously along the ribbed surface and thus dissipate the heat arising in the OLED.

In accordance with at least one embodiment, the first substrate material is glass and the second substrate material is air. In other words, a structured glass substrate in the form of a cooling rib is provided here which the second substrate material air from outside washes around and the heat is thus dissipated.

In accordance with at least one embodiment, the organic light emitting diode has an encapsulation. In particular, the organic light emitting diode has a thin film encapsulation. The thin film encapsulation can protect the organic functional layer stack and the electrodes against damaging materials from the surroundings, such as, for example, moisture and/or oxygen and/or other corrosive substances, such as hydrogen sulfide, for example. For this purpose, the encapsulation can comprise one or a plurality of thin layers which are applied for example by means of an atomic layer deposition method and which comprise for example one or a plurality of the materials aluminum oxide, zinc oxide, zirconium oxide, titanium oxide, hafnium oxide, lanthanum oxide and tantalum oxide. The encapsulation can furthermore comprise on a thin film encapsulation, for example, a mechanical protection in the form of a plastic layer and/or a laminated glass layer, as a result of which anti-scratch protection can be achieved, for example. Alternatively, other encapsulations are also possible, for example in the form of a glass cover applied by adhesive bonding.

The invention furthermore relates to a method for producing an optoelectronic component. In particular, the optoelectronic component described here is produced by said method. That is to say that all features disclosed for the method are also disclosed for the optoelectronic component, and vice versa.

In accordance with at least one embodiment, a substrate is provided. Alternatively or additionally, a cover element is provided. At least one substrate cavity and/or cover element cavity is produced into the substrate and/or cover element.

This can be effected for example by means of etching, laser treatment, water jet and/or by water jet processing. A hollow space or a structure thus arises in the substrate and/or in the cover element. The structured substrate and/or cover element can be provided for the further processing. In particular, the structured substrate and/or cover element can be arranged at an organic light emitting diode. In particular, the organic light emitting diode is applied at least to the substrate. Alternatively, the organic light emitting diode can also be arranged between the structured substrate and the structured cover element. Afterward, the substrate cavity and/or the cover element cavity can be filled with the second substrate material and/or the second cover material. This is followed by closing at least the substrate cavity with a first covering layer and/or the cover element cavity with a second covering layer. In particular, the second substrate material and/or the second cover material are/is liquid. The sealing by means of the first and/or second covering layer can produce a sealing of the cavities. This can be produced for example by applying by adhesive bonding a transparent first and/or second covering layer, in particular a covering film.

Carrying out method step D) after C) is advantageous since applying the organic light emitting diode to the substrate and/or cover element and/or between substrate and cover element is carried out in high vacuum and the second substrate material and/or the second cover material would thus escape if they/it were introduced into the cavities before method step C).

Further advantages, advantageous embodiments and developments are evident from the exemplary embodiments described below in association with the figures.

Figure 7:
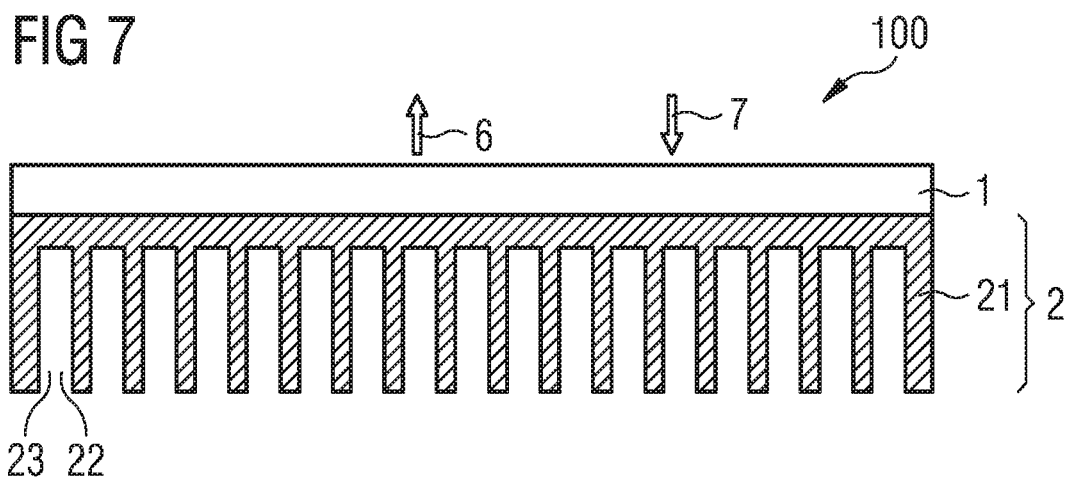

In the figures:

FIG. 1 schematically shows a side view of an optoelectronic component in accordance with one embodiment, FIG. 2 schematically shows a side view of an optoelectronic component in accordance with one embodiment, FIG. 3 schematically shows a side view of an optoelectronic component in accordance with one embodiment, FIG. 4 schematically shows an excerpt of an optoelectronic component in accordance with one embodiment, FIG. 5 schematically shows a side view of an optoelectronic component in accordance with one embodiment, FIG. 6 schematically shows a side view of an optoelectronic component in accordance with one embodiment, FIG. 7 schematically shows a side view of an optoelectronic component in accordance with one embodiment.

In the exemplary embodiments and figures, elements which are identical, of identical type or act identically may be provided in each case with the same reference signs. The illustrated elements and their size relationships among one another should not be regarded as true to scale. Rather, individual elements such as, for example, layers, structural parts, components and regions may be illustrated with exaggerated size in order to enable better illustration and/or in order to afford a better understanding.

FIG. 1 shows a schematic side view of an optoelectronic component 100 in accordance with one embodiment. The optoelectronic component 100 comprises an organic light emitting diode 1. The organic light emitting diode 1 comprises a first electrode 11, which can be shaped as an anode, for example, and a second electrode 15, which can be shaped as a cathode. At least three layers, a light emitting organic layer 13, a hole transport layer 12 and an electron injection layer 14, are arranged between the first electrode 11 and the second electrode 15. Alternatively or additionally, instead of the layers 12 and 14, other or further layers can also be present which are selected from a group comprising hole injection layers, hole transport layers, electron injection layers, electron transport layers, hole blocking layers and electron blocking layers.

Alternatively or additionally, the organic light emitting diode 1 can comprise an encapsulation, for example a thin film encapsulation (not shown here). The organic light emitting diode 1 is capable of emitting radiation. During the operation of the organic light emitting diode 1, the latter is also capable of emitting heat. The organic light emitting diode 1 is arranged on a substrate 2 directly, that is to say in direct mechanical contact. The substrate 2 comprises a first substrate material 21, for example glass. The substrate 2 furthermore comprises at least one substrate cavity 22. FIG. 1 shows four substrate cavities 22 by way of example. The substrate cavities 22 are filled with a second substrate material 23. In particular, the second substrate material 23 can be liquid or gaseous. By way of example, the second substrate material 23 can be a liquid selected from glycerol, immersion oil, cedar oil, silicone oil, fluorocarbon or combinations thereof. In particular, the second substrate material 23 can be gaseous, for example air. If the second substrate material 23 is a liquid, in particular, then the optoelectronic component 100 in particular additionally comprises a first covering layer 3 (not shown here). The first covering layer 3 covers at least the substrate cavities 22.

FIG. 2 shows a schematic side view of an optoelectronic component 100 in accordance with one embodiment. The optoelectronic component 100 comprises an organic light emitting diode 1. The organic light emitting diode 1 is arranged on a substrate 2. The substrate 2 comprises at least one substrate cavity 22, here three substrate cavities 22. The substrate cavities 22 can be filled with a second substrate material 23, for example glycerol. A first covering layer 3 is disposed directly downstream of the substrate. The first covering layer 3 is shaped with a homogeneous layer thickness and covers both the substrate cavities 22 and the substrate 2. In particular, the first covering layer 3 has a lateral extent identical to that of the substrate 2. In particular, the first substrate material 21 is glass and the second substrate material 23 is glycerol. In comparison with glass, glycerol has the advantage that it has a higher specific heat capacity and can thus more easily dissipate the heat arising in the organic light emitting diode 1. Moreover, glycerol has a refractive index approximately identical to that of glass, such that the radiation arising in the organic light emitting diode 1 can easily be coupled out via the transparent substrate 2 and via the transparent first covering layer 3. In particular, the organic light emitting diode 1 is shaped as a transparent OLED.

FIG. 3 shows a schematic side view of an optoelectronic component 100 in accordance with one embodiment. The optoelectronic component 100 is shaped here as a transparent optoelectronic component 100. This means that both the cover element 4, the substrate 2, the first and second covering layers 3, 5 and the organic light emitting diode 1 are shaped in transparent fashion. FIG. 3 shows an organic light emitting diode 1. The organic light emitting diode 1 is arranged between a substrate and the cover element 4. The substrate 2 and the cover element 4 are structured. In particular, the substrate 2 and the cover element 4 have cavities 22, 42, within which a second substrate material 23 and/or a second cover material 43 are/is arranged. In particular, the second substrate and/or cover material 23, 43 has a refractive index identical to that of the first substrate and/or cover material 41, 21 with a deviation of +/−0.02. In particular, the second substrate and/or cover material 23, 43 has a higher specific heat capacity than the respective first substrate and/or cover material 21, 41. In other words, a transparent optoelectronic component is provided here which emits on both sides, that is to say both via the substrate 2 and via the cover element 4, and exhibits an outstanding dissipation of the heat generated in the organic light emitting diode 1.

The substrate 2 is covered with a first covering layer 3; in particular, the first covering layer 3 covers the cavities 22 filled for example with a liquid. The cover element 4 is covered with a second covering layer 5, which covers in particular the cover element cavities 42. The cavities are shaped in particular as semicircles in side view or as hemispheres in a plan view of the optoelectronic component 100.

FIG. 4 shows an excerpt from an optoelectronic component 100 in accordance with one embodiment. The optoelectronic component 100 comprises an organic light emitting diode 1, downstream of which is disposed a substrate 2 having differently shaped cavities 22. A first covering layer 3 is disposed downstream of the substrate 2. The substrate 2 comprises a first substrate material 21, for example glass. The substrate cavities 22 are shaped here in the form of a truncated pyramid and/or a hemisphere. In particular, the substrate cavities 22, where the evolution of heat in the OLED is the highest, extend far toward the organic light emitting diode 1, but without touching the latter directly.

FIG. 5 shows a schematic side view of an optoelectronic component 100 in accordance with one embodiment. The optoelectronic component 100 comprises an organic light emitting diode 1. The organic light emitting diode 1 is arranged between a cover element 4 and a substrate 2. A second covering layer 5 is disposed downstream of the cover element 4 and a first covering layer 3 is disposed downstream of the substrate 2. FIG. 5 differs from FIG. 3 in that the cover element cavities and/or substrate element cavities are shaped differently. The substrate cavities 22 have a rectangular shape in side view and/or are at least partly connected to one another. The cover element cavities 42 are configured in circular fashion in side view. An optoelectronic component 100 can thus be provided which exhibits better heat dissipation in one direction, for example in the direction of the substrate 2 in comparison with the cover element 4, or vice versa.

FIG. 6 shows a schematic side view of an optoelectronic component in accordance with one embodiment. The optoelectronic component 100 differs in comparison with the optoelectronic component from FIG. 2 in that it has cylindrical cavities or microchannels 22. The substrate cavities 22 can also be connected to one another. It is also possible in part for only a few substrate cavities 22 to be connected to one another. It is thus possible to achieve a better heat distribution in the second substrate material 23.

FIG. 7 shows a schematic side view of an optoelectronic component 100 in accordance with one embodiment. The optoelectronic component 100 is shaped in particular as a top emitter, that is to say emits the radiation 6 via the radiation main side 7 facing away from the substrate 2. A substrate 2 is disposed downstream of the organic light emitting diode 1. The substrate 2 is shaped in a structured fashion. The substrate 2 has a ribbed surface. The substrate 2 comprises a first substrate material 21, for example glass. In other words, the substrate 2 is shaped in the form of a so-called cooling rib. As a result, the second gaseous substrate material 23, such as air, for example, can circulate around the cooling ribs, that is to say the ribbed surface, and thus dissipate the heat produced in the organic light emitting diode 1.

The exemplary embodiments and their features described in association with the figures can also be combined with one another in accordance with further exemplary embodiments, even if such combinations are not explicitly shown in the figures. Furthermore, the exemplary embodiments described in association with the figures can have additional or alternative features in accordance with the description in the general part.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic component comprising:
   an organic light emitting diode that emits radiation and/or heat,
   a substrate on which the organic light emitting diode is arranged,
   wherein the substrate comprises a first substrate material and at least one substrate cavity filled with a second substrate material different from the first substrate material, the second substrate material dissipates the heat emitted by the organic light emitting diode, and the substrate cavity and the second substrate material are spaced from the organic light emitting diode.

2. The optoelectronic component according to claim 1, wherein the organic light emitting diode is transparent.

3. The optoelectronic component according to claim 1, wherein the first substrate material and/or the first cover material are/is solid and the second substrate material and/or the second cover material are/is liquid, wherein the first substrate material has a first specific heat capacity $c1$, the second substrate material has a second specific heat capacity $c2$, and a first cover material has a third specific heat capacity $c3$ and a second cover material has a fourth specific heat capacity $c4$,
   wherein $c2 > 3 \cdot c1$ and/or $c4 > 3 \cdot c3$.

4. The optoelectronic component according to claim 1, wherein the first substrate material has a first specific heat capacity $c1$, the second substrate material has a second specific heat capacity $c2$, and a first cover material has a third specific heat capacity $c3$ and a second cover material has a fourth specific heat capacity $c4$,
   wherein $c1 = c3$ and/or $c2 = c4$.

5. The optoelectronic component according to claim 1, wherein the first substrate material has a refractive index $n1$, wherein the second substrate material has a refractive index $n2$, and a first cover material has a refractive index $n3$ and the second cover material has a refractive index $n4$,
   wherein $n1 = n3$ and $n2 = n1 \pm 0.02$ and/or $n2 = n4$ and $n4 = n3 \pm 0.02$.

6. The optoelectronic component according to claim 1, wherein the first substrate material and/or first cover material comprise(s) glass and the second substrate material and/or the second cover material are/is selected from a group comprising glycerol, immersion oil, cedar oil, silicone oil, mineral oil, glycol, fluorocarbons.

7. The optoelectronic component according to claim 1, which additionally comprises a first covering layer and/or a second covering layer, wherein the first covering layer is disposed directly downstream of the substrate and covers at least the substrate cavity, wherein the second covering layer is disposed directly downstream of the cover element and covers at least the cover element cavity.

8. The optoelectronic component according to claim 7, wherein the first covering layer and/or the second covering layer are/is shaped as a prefabricated self-adhesive plastic film.

9. The optoelectronic component according to claim 1, wherein the substrate cavity and/or the cover element cavity are/is shaped in the form of a hemisphere, a cylinder or a cuboid.

10. The optoelectronic component according to claim 1, wherein the substrate and/or the cover element are shaped in each case as a layer having a uniform layer thickness, wherein the substrate cavity and/or cover element cavity are/is shaped in each case as a cylinder having a height $h$, wherein the height $h$ corresponds to two thirds of the layer thickness of the substrate and/or of the cover element.

11. The optoelectronic component according to claim 1, wherein the organic light emitting diode emits radiation via the radiation main side facing away from the substrate, wherein the substrate cavity has a ribbed surface, wherein the first substrate material is solid and the second substrate material is gaseous, wherein the second substrate material envelops the ribbed surface, such that the second substrate material dissipates the heat emitted by the organic light emitting diode.

12. The optoelectronic component according to claim 11, wherein the first substrate material is glass and the second substrate material is air.

13. A method for producing an optoelectronic component according to claim 1, comprising the following steps:
    A) providing a substrate and/or a cover element,
    B) producing at least one substrate cavity into the substrate and/or producing at least one cover element cavity into the cover element,
    C) applying an organic light emitting diode at least to the substrate or cover element, or arranging the organic light emitting diode between the substrate and the cover element, subsequently
    D) filling the substrate cavity and/or cover element cavity with a second substrate material and/or a second cover material,
    E) closing at least the substrate cavity with a first covering layer and/or the cover element cavity with a second covering layer.

14. The method according to claim 13, wherein step B) is effected by means of etching, laser treatment and/or water jet processing.

15. An optoelectronic component comprising:
    an organic light emitting diode that emits radiation and/or heat,
    a substrate on which the organic light emitting diode is arranged, wherein the substrate comprises a first substrate material and at least one substrate cavity filled with a second substrate material different from the first substrate material, the second substrate material dissipates the heat emitted by the organic light emitting diode, and
    a cover element comprising a first cover material and at least one cover element cavity, wherein the at least one cover element cavity is filled with a second cover material different from the first cover material,
    wherein the organic light emitting diode is arranged between the cover element and the substrate and emits radiation both via the cover element and via the substrate, the first substrate material has a refractive index n1 and a first specific heat capacity c1, the second substrate material has a refractive index n2=n1±0.05 and a second specific heat capacity c2>c1, and the first cover material has a refractive index n3 and a third specific heat capacity c3 and the second cover material has a refractive index n4=n3±0.05 and a fourth specific heat capacity c4>c3.

\* \* \* \* \*